US007786740B2

(12) United States Patent  (10) Patent No.: US 7,786,740 B2
Kister  (45) Date of Patent: Aug. 31, 2010

(54) PROBE CARDS EMPLOYING PROBES HAVING RETAINING PORTIONS FOR POTTING IN A POTTING REGION

(75) Inventor: January Kister, Portola Valley, CA (US)

(73) Assignee: Astria Semiconductor Holdings, Inc., Carlsbad, CA (US)

( * ) Notice: Subject to any disclaimer, the term of this patent is extended or adjusted under 35 U.S.C. 154(b) by 135 days.

(21) Appl. No.: 11/580,204

(22) Filed: Oct. 11, 2006

(65) Prior Publication Data

US 2008/0088327 A1 Apr. 17, 2008

(51) Int. Cl.
*G01R 31/02* (2006.01)
(52) U.S. Cl. .................................. 324/754; 324/761
(58) Field of Classification Search .............. 324/754, 324/760, 761
See application file for complete search history.

(56) References Cited

U.S. PATENT DOCUMENTS

| | | | |
|---|---|---|---|
| 3,518,612 | A | 6/1970 | Dunman et al. |
| 3,599,093 | A | 8/1971 | Oates |
| 3,710,251 | A | 1/1973 | Hagge et al. |
| 3,812,311 | A | 5/1974 | Kvaternik |
| 4,027,935 | A | 6/1977 | Byrnes et al. |
| 4,115,736 | A | 9/1978 | Tracy |
| 4,116,523 | A | 9/1978 | Coberly et al. |
| 4,423,376 | A | 12/1983 | Byrnes et al. |
| 4,525,697 | A | 6/1985 | Jones et al. |
| 4,532,423 | A | 7/1985 | Tojo et al. |
| 4,593,961 | A | 6/1986 | Cosmo |
| 4,618,767 | A | 10/1986 | Smith et al. |
| 4,618,821 | A | 10/1986 | Lenz |
| 4,706,019 | A | 11/1987 | Richardson |

(Continued)

FOREIGN PATENT DOCUMENTS

EP   0681186   11/1995

(Continued)

OTHER PUBLICATIONS

Sporck, Nicholas, "A New Probe Card Technology Using Compliant Microsprings", *Proceedings 1997 IEEE International Test Conference*, Nov. 1, 1997, pp. 527-532.

*Primary Examiner*—Jermele M Hollington
(74) *Attorney, Agent, or Firm*—Deborah A. Peacock; Samantha A. Updegraff; Peacock Myers, P.C.

(57) ABSTRACT

Method and apparatus using a retention arrangement for probes used for electrical testing of a device under test (DUT). The apparatus has a number of probes each of which has a connect end for applying a test signal, a retaining portion, at least one arm portion and a contact tip for making an electrical contact with the DUT. A retention arrangement has a tip holder for holding each of the probes by its contacting tip and a plate with openings for holding each of the probes below the retaining portion. The retaining portion of each of the probes is potted in a potting region defined above the plate with the aid of a potting agent. The apparatus can be used with space transformers, a variety of probes of different geometries and scrub motion characteristics and is well-suited for use in probe card apparatus under tight pitch and small tolerance requirements.

93 Claims, 8 Drawing Sheets

U.S. PATENT DOCUMENTS

| | | |
|---|---|---|
| 4,730,158 A | 3/1988 | Kasai et al. |
| 4,747,698 A | 5/1988 | Wickramasinghe et al. |
| 4,757,255 A | 7/1988 | Margozzi |
| 4,772,846 A | 9/1988 | Reeds |
| 4,773,877 A | 9/1988 | Kruger et al. |
| 4,807,159 A | 2/1989 | Komatsu et al. |
| 4,901,013 A | 2/1990 | Benedetto et al. |
| 4,967,148 A * | 10/1990 | Doemens et al. ............ 324/754 |
| 5,015,947 A | 5/1991 | Chism |
| 5,026,291 A | 6/1991 | David |
| 5,030,318 A | 7/1991 | Reche |
| 5,145,384 A | 9/1992 | Asakawa et al. |
| 5,205,739 A | 4/1993 | Malo et al. |
| 5,207,585 A | 5/1993 | Byrnes |
| 5,230,632 A | 7/1993 | Baumberger et al. |
| 5,354,205 A | 10/1994 | Feigenbaum et al. |
| 5,422,574 A | 6/1995 | Kister |
| 5,430,614 A | 7/1995 | Difrancesco |
| 5,436,571 A | 7/1995 | Karasawa |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A * | 6/1997 | Beaman et al. ............ 324/754 |
| 5,644,249 A | 7/1997 | Kister |
| 5,676,599 A | 10/1997 | Ricks et al. |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,773,987 A | 6/1998 | Montoya |
| 5,802,699 A | 9/1998 | Fjelstad et al. |
| 5,806,181 A | 9/1998 | Khandros et al. |
| 5,832,601 A | 11/1998 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A * | 6/1999 | Khandros et al. ............ 361/776 |
| 5,923,178 A * | 7/1999 | Higgins et al. ............ 324/754 |
| 5,926,951 A | 7/1999 | Khandros et al. |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A * | 9/1999 | Vinh ............ 324/761 |
| 5,970,167 A | 10/1999 | Colvin |
| 6,027,630 A | 2/2000 | Cohen |
| 6,029,344 A | 2/2000 | Khandros et al. |
| 6,064,215 A | 5/2000 | Kister |
| 6,066,957 A | 5/2000 | Van Loan et al. |
| 6,071,630 A * | 6/2000 | Tomaru et al. ............ 428/627 |
| 6,086,386 A | 7/2000 | Fjelstad et al. |
| 6,133,072 A | 10/2000 | Fjelstad |
| 6,204,674 B1 | 3/2001 | Dabrowiecki et al. |
| 6,205,660 B1 | 3/2001 | Fjelstad et al. |
| 6,218,203 B1 | 4/2001 | Khoury et al. |
| 6,246,245 B1 | 6/2001 | Akram et al. |
| 6,247,228 B1 | 6/2001 | Distefano et al. |
| 6,259,261 B1 | 7/2001 | Engelking et al. |
| 6,278,284 B1 | 8/2001 | Mori et al. |
| 6,292,003 B1 | 9/2001 | Fredrickson et al. |
| 6,344,753 B1 | 2/2002 | Takada et al. |
| 6,411,112 B1 | 6/2002 | Das et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,437,584 B1 | 8/2002 | Gleason et al. |
| 6,441,315 B1 * | 8/2002 | Eldridge et al. ............ 174/260 |
| 6,443,784 B1 | 9/2002 | Kimoto |
| 6,482,013 B2 | 11/2002 | Eldridge et al. |
| 6,486,689 B1 | 11/2002 | Nishikawa |
| 6,525,552 B2 | 2/2003 | Kister |
| 6,529,021 B1 | 3/2003 | Yu et al. |
| 6,530,148 B1 | 3/2003 | Kister |
| 6,566,898 B2 | 5/2003 | Theissen et al. |
| 6,570,396 B1 | 5/2003 | Kister |
| 6,573,738 B1 | 6/2003 | Matsuo et al. |
| 6,575,767 B2 | 6/2003 | Satoh et al. |
| 6,576,485 B2 | 6/2003 | Zhou et al. |
| 6,586,955 B2 | 7/2003 | Fjelstad et al. |
| 6,633,176 B2 | 10/2003 | Takemoto et al. |
| 6,646,455 B2 | 11/2003 | Maekawa et al. |
| 6,676,438 B2 * | 1/2004 | Zhou et al. ............... 439/482 |
| 6,677,245 B2 | 1/2004 | Zhou et al. |
| 6,707,311 B2 | 3/2004 | Hohenwarter |
| 6,727,719 B2 | 4/2004 | Liao et al. |
| 6,731,123 B2 | 5/2004 | Kimoto |
| 6,765,228 B2 | 7/2004 | Lin et al. |
| 6,842,023 B2 | 1/2005 | Yoshida et al. |
| 6,847,221 B2 | 1/2005 | Kimoto et al. |
| 6,853,208 B2 * | 2/2005 | Okubo et al. ............... 324/758 |
| 6,881,974 B2 | 4/2005 | Wood et al. |
| 6,890,185 B1 | 5/2005 | Kister et al. |
| 6,897,666 B2 | 5/2005 | Swettlen et al. |
| D507,198 S | 7/2005 | Kister |
| 6,917,102 B2 | 7/2005 | Zhou et al. |
| 6,917,525 B2 | 7/2005 | Mok et al. |
| D510,043 S | 9/2005 | Kister |
| 6,956,389 B1 | 10/2005 | Mai |
| 6,965,245 B2 | 11/2005 | Kister et al. |
| 6,970,005 B2 | 11/2005 | Rincon et al. |
| 7,015,707 B2 | 3/2006 | Cherian |
| 7,046,021 B2 | 5/2006 | Kister |
| 7,064,564 B2 | 6/2006 | Kister et al. |
| D525,207 S | 7/2006 | Kister et al. |
| 7,078,921 B2 | 7/2006 | Haga et al. |
| 7,088,118 B2 | 8/2006 | Liu et al. |
| 7,091,729 B2 | 8/2006 | Kister |
| 7,109,731 B2 | 9/2006 | Gleason et al. |
| 7,059,865 B2 | 11/2006 | Kister et al. |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |
| 7,265,565 B2 | 9/2007 | Chen et al. |
| 7,274,195 B2 | 9/2007 | Takemoto et al. |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 2002/0070743 A1 | 6/2002 | Felici et al. |
| 2002/0125584 A1 | 9/2002 | Umehara et al. |
| 2002/0153913 A1 * | 10/2002 | Okubo et al. ............... 324/761 |
| 2002/0194730 A1 | 12/2002 | Shih et al. |
| 2003/0027423 A1 | 2/2003 | Zhou et al. |
| 2003/0116346 A1 | 6/2003 | Forster et al. |
| 2004/0104737 A1 | 6/2004 | Haga et al. |
| 2004/0119485 A1 | 6/2004 | Koch et al. |
| 2004/0239352 A1 | 12/2004 | Mizoguchi |
| 2005/0012513 A1 | 1/2005 | Cheng |
| 2005/0179458 A1 | 8/2005 | Chen et al. |

| | | | | | | |
|---|---|---|---|---|---|---|
| 2005/0189955 A1 | 9/2005 | Takemoto et al. | | 2007/0167022 A1 | 7/2007 | Tsai et al. |
| 2005/0189958 A1 | 9/2005 | Chen et al. | | FOREIGN PATENT DOCUMENTS | | |
| 2006/0033516 A1 | 2/2006 | Rincon et al. | EP | 0764352 | 5/2004 | |
| 2006/0073712 A1 | 4/2006 | Suhir | JP | 11241690 | 9/1999 | |
| 2006/0082380 A1 | 4/2006 | Tanioka et al. | WO | WO 8704568 | 7/1987 | |
| 2006/0170440 A1 | 8/2006 | Sudin | WO | WO 96/15458 | 5/1996 | |
| 2006/0171425 A1 | 8/2006 | Lee et al. | * cited by examiner | | | |

PROBE CARDS EMPLOYING PROBES HAVING RETAINING PORTIONS FOR POTTING IN A POTTING REGION

RELATED APPLICATIONS

This application is related to U.S. patent application Ser. No. 11/302,650 filed on Dec. 14, 2005 and is herein incorporated in its entirety.

FIELD OF THE INVENTION

This invention relates generally to apparatus and method for retaining probes in an electrical testing arrangement such as a probe card, and more specifically to potting of such probes in a retention arrangement belonging to the probe card to ensure superior mechanical and electrical performance.

BACKGROUND ART

The testing of semiconductor wafers and other types of integrated circuits (ICs), collectively known as devices under test (DUTs), needs to keep pace with technological advances. Each IC has to be individually tested, typically before dicing, in order to ensure that it is functioning properly. The demand for testing products is driven by considerations of new chip designs and higher volumes.

In particular, chips are getting smaller and they have more tightly spaced contact pads. The pads are no longer located about the circuit perimeter, but in some designs may be found within the area occupied by the circuit itself. As a result, the spacing or pitch of probe arrays required to establish electrical contact with the pads or bumps is decreasing. In addition, the requirements on planarity are increasing.

Some of the problems associated with small pitch of contact pads and their arrangement in a dense two-dimensional array are addressed in the prior art. For example, U.S. Pat. No. 6,881,974 to Wood et al. teaches to arrange probes in a probe card that has a substrate with a plurality of blind holes on a front face. The holes are filled with a metal to establish electrical contact for testing purposes and have closed bottoms spaced from a back of the substrate. Another approach is taught in U.S. Pat. No. 6,586,955 and U.S. Published Application No. 2002/0000815 both to Fjelstad et al. where probe cards include a layer of dielectric material provided with a plurality of cavities on a substrate. The dielectric material separates the fusible conductive material that is used to form the probe contacts. Both approaches provide ways to arrange probes that can address pads in a dense array.

In an approach that employs a housing for holding the individual probes, U.S. Pat. No. 6,566,898 to Theissen et al. teach an improved vertical pin probing device that has upper and lower spacers made of Invar. The spacers have a thin sheet of silicon nitride ceramic material held in a window in the spacer by an adhesive. The sheets of silicon nitride have laser-drilled matching patterns of holes supporting the probe pins and insulating them from the housing. The probes held in the holes can be arranged to address pads in a dense array.

Unfortunately, merely providing a geometry or method of holding probes that can address a dense array of pads is not sufficient. It is also important to ensure that the probes have suitable mechanical resilience and compliance properties. One way of addressing these mechanical issues is discussed, for example, in U.S. Published Application No. 2002/0117330 to Eldridge et al. This reference teaches structures that have improved resilience or compliance because the wire used for contact is overcoated with at least one layer of a material chosen for its structural resiliency or compliance characteristics. The probes have springy shapes and are attached to a substrate in, e.g., a probe card.

Although the prior art solutions individually address some of the problems, there is no apparatus or method that combines the requisite characteristics in a single probe card or testing apparatus. Specifically, what is needed is an electrical testing apparatus that can address densely packed pads or bumps with probes that are held securely while offering requisite mechanical properties such as resilience, compliance and reliable scrub motion to remove oxide from the pads or bumps.

OBJECTS AND ADVANTAGES

In view of the above prior art limitations, it is an object of the invention to provide for a method and apparatus for electrical testing of devices under test (DUTs) that have densely spaced contact pads or bumps. The object is to ensure that the probes used in such apparatus are appropriately held and designed to ensure advantageous mechanical properties, including resilience, compliance and scrub motion.

It is another object of the invention to ensure that the apparatus is easy to assemble and disassemble despite the small pitch of the probes.

These and other objects and advantages of the invention will become apparent from the ensuing description.

SUMMARY OF THE INVENTION

The objects and advantages of the invention are secured by a method and an apparatus for electrical testing of a device under test (DUT). The apparatus has a number of probes each of which has a connect end for applying a test signal, a retaining portion, at least one arm portion and a contact tip for making an electrical contact with the DUT. Further, the apparatus has a retention arrangement for holding each of the probes. Specifically, the retention arrangement has a tip holder for holding each of the probes by its contacting tip and a plate with openings for holding each of the probes below the retaining portion. The retaining portion of each of the probes is potted in a potting region defined above the plate with the aid of a potting agent. The potting agent can be any suitable potting material such as an epoxy selected for appropriate viscosity and curing properties. In some embodiments the apparatus further comprises a lateral enclosure or, more generally a lateral barrier for enclosing the potting region to help contain the epoxy prior to curing.

In a preferred embodiment the openings in the plate are laser-machined openings. The laser machining process allows one to achieve very precise dimensional tolerances and opening profiles.

In some applications the apparatus is used in conjunction with a space transformer. The space transformer has closely spaced or high pitch contacts for contacting each of the probes at the connect end. The connection can be permanent or, preferably temporary. Suitable temporary connections can be achieved by soldering. The use of the space transformer is particularly advantageous when the apparatus is employed in a probe card.

The apparatus admits the use of many types of probes. Preferably, however, the probes are non-linear. For example, each probe has at least two arm portions joined by a knee. In one specific embodiment, the probes have at least two arm portions with a base arm portion extending away from a center axis of the probe and a reverse arm portion extending toward the center axis. The knee joins the base arm portion with the reverse arm portion. The contacting tip is located on the reverse arm portion distal from the knee and the contacting tip has a non-zero offset relative to the center axis. Alternatively, the probes can have at least one non-linear arm portion that extends from the center axis such that the contacting tip again exhibits a non-zero offset relative to the center axis. In any of the embodiments of the apparatus, the probes can be of the type endowed with a protrusion on the contacting tip for ensuring high quality electrical contact.

The invention further extends to a method for electrical testing of a DUT with a number of probes each having a connect end for applying a test signal, at least one arm portion and a contacting tip for making an electrical contact with the DUT. Each of the probes is provided with a retaining portion and a retention arrangement is provided for holding each of the probes by its contacting tip and also below its retaining portion. According to the method a potting region is created for potting the retaining portion of each probe in a potting agent. The potting agent is admitted into the potting region once the probes are properly held to pot the retaining portions of the probes.

Preferably, the retention arrangement has a plate with holes for holding each of the probes below its retaining portion and the holes are made by laser machining. Additionally, the retention arrangement has a tip holder for holding each of the probes by its contacting tip. The tip holder can be removed after potting or left in place for testing.

According to the method, a space transformer can be provided for contacting the probes at their connect ends and applying the test signals thereto.

A detailed description of the preferred embodiments of the invention is presented below in reference to the appended drawing figures.

BRIEF DESCRIPTION OF THE DRAWING FIGURES

DETAILED DESCRIPTION

Figure 1:
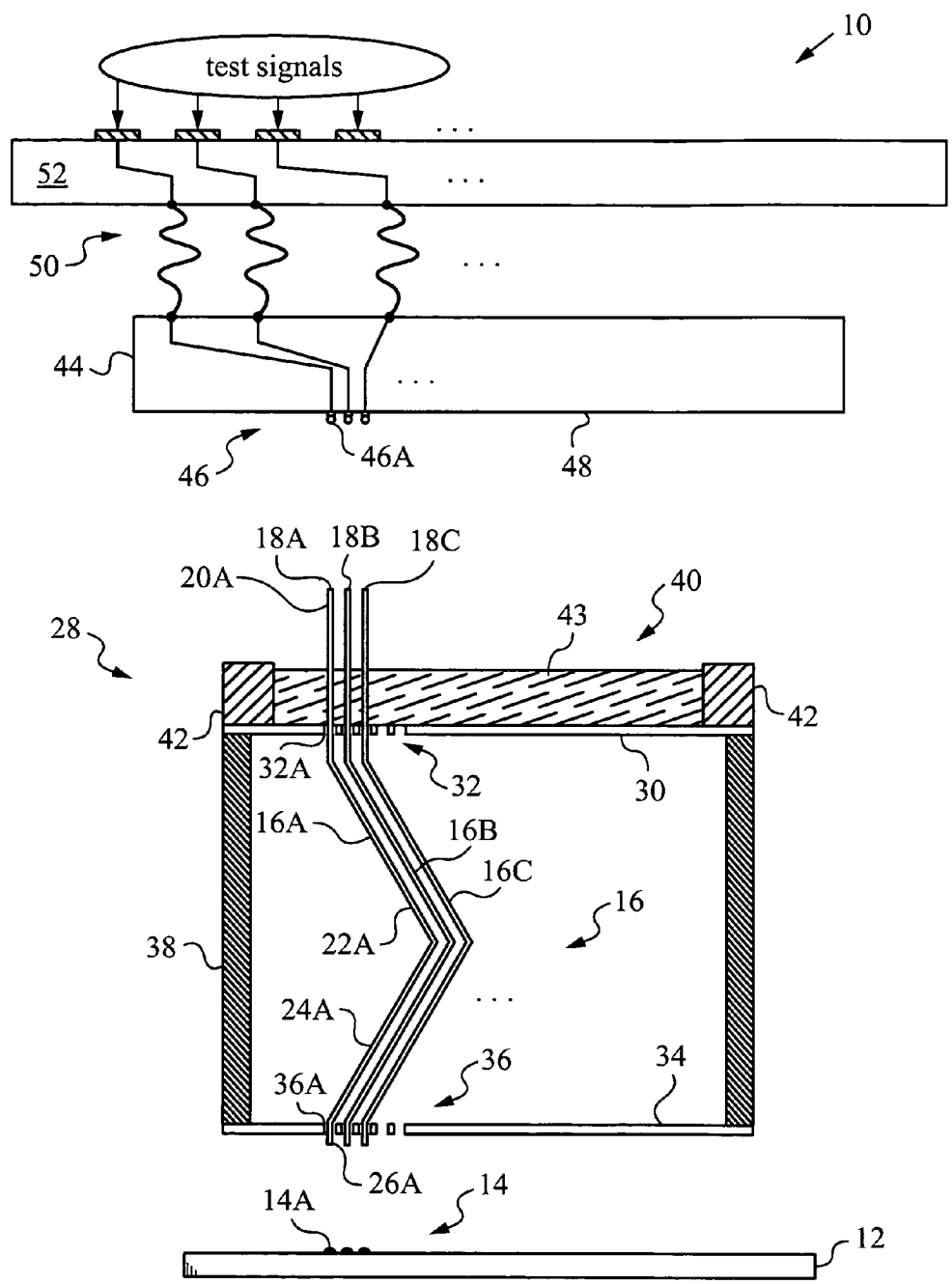
FIG. 1 is a diagram illustrating an apparatus of the invention employed with a space transformer.

The present invention will be best understood by first reviewing an apparatus 10 of the invention as shown in the diagram of FIG. 1. Apparatus 10 can be employed in a probe card or other electrical testing equipment for testing a device under test (DUT) 12. Frequently, DUT 12 is an integrated circuit on a wafer that requires testing prior to dicing. Alternatively, DUT 12 is an electronic device or circuit that is already mounted. The functionality of DUT 12 is verified by applying test signals to a number of its bumps or pads 14.

Apparatus 10 has a number of probes 16 arranged in an array and designed for establishing electrical contact with pads or bumps 14. Typically, the number of probes 16 is large and their spacing or pitch is very small, e.g., on the order of several microns. For clarity, only three probes 16A, 16B, 16C are illustrated. The construction of all probes 16 is analogous and will be explained by referring explicitly to probe 16A.

Probe 16A has a connect end 18A for applying the test signal, a retaining portion 20A and two arm portions 22A, 24A. Arm portion 24A terminates in a contacting tip 26A for making electrical contact with a corresponding bump 14A of DUT 12.

Apparatus 10 has a retention arrangement 28 for holding each of probes 16 below its retaining portion 20 and just above arm portions 22, 24. More precisely, retention arrangement 28 has a plate 30 with openings 32. Preferably, plate 30 is a ceramic plate. Openings 32 are provided for receiving and guiding retaining portions 20 of probes 16. To ensure accurate placement of probes 16 in retention arrangement 28 openings 32 are precision machined. Preferably, openings 32 are laser-machined openings.

Further, retention arrangement 28 has a holder 34 for holding probes 16 by their contacting tips 26. Holder 34 can be made of various materials, but in the present case it is made of polyimide. A series of holes 36 in holder 34 is designed to retain contacting tips 26. Holes 36 preferably have a suitable structure or cross-section to ensure that, once inserted, contacting tips 26 stay in holes 36 unless intentionally removed. A frame 38 keeps holder 34 in the appropriate position with respect to plate 30 to ensure that probes 16 are all well-aligned and their contacting tips 26 maintain a high level of planarity.

Retaining portions 20 of probes 16 are potted with a potting agent 43 in a potting region 40 defined above plate 30. A lateral enclosure 42, here in the form of a lateral barrier mounted on top of and about the perimeter of plate 30 defines potting region 40. A person skilled in the art will recognize, that lateral enclosure 42 is especially useful for containing any low-viscosity potting agent 43 prior to curing or when a significant thickness of potting agent 43 needs to be employed. A suitable potting agent 43 is an epoxy that exhibits proper wetting with respect to plate 30 and retaining portions 20 of probes 16 and hardens upon contact with atmospheric oxygen. Potting agent 43 may be poured into potting region 40 from above once probes 16 are properly aligned both horizontally and vertically. As potting agent 42 cures and hardens, probes 16 are retained in their proper positions.

Apparatus 10 also has a space transformer 44 with probe contacts 46 on its bottom surface 48 for contacting probes 16 at their connect ends 18. Specifically, space transformer 44 is employed for establishing electrical connections between test signal leads 50 from a testing device 52, e.g., a testing circuit on a printed circuit board, and probes 16. In contrast to signal leads 50, probe contacts 46 on bottom surface 48 are densely spaced and can be directly connected to probes 16. For example, in the case of probe 16A, its connect end 18A is assigned to establish electrical connection with contact 46A. In practice this is preferably done by providing a soldering ball on contact 46A and soldering connect end 18A thereto. Other alternatives, such as a side friction connector between connect end 18A and contact 46A can also be used to establish electrical connection.

Space transformer 44 allows the user to convert relatively sparsely spaced leads 50 to an array of much more densely spaced or high pitch probe contacts 46 for accessing very densely spaced probes 16. Probes 16, in turn, require tight spacing in order to access very densely packed and small pads or bumps 14 of DUT 12. Various types of space transformers and routing strategies are known to those skilled in the art. Any of those can be applied in apparatus 10. In addition, testing device 52 can generate test signals directly, receive external instructions for generating test signals or simply receive some or all of the test signals and assign them to signal leads 50.

During operation, probes 16 of apparatus 10 are placed in physical contact with bumps 14 to establish electrical contact. Electrical contact is not only due to physical contact, but also due to a scrubbing motion executed by contacting tips 26 of probes 16 while engaging with bumps 14. The scrubbing motion removes surface oxidation from bumps 14 and thus ensures a low-resistance electrical contact so that the test signals are efficiently delivered to bumps 14.

Figure 2:
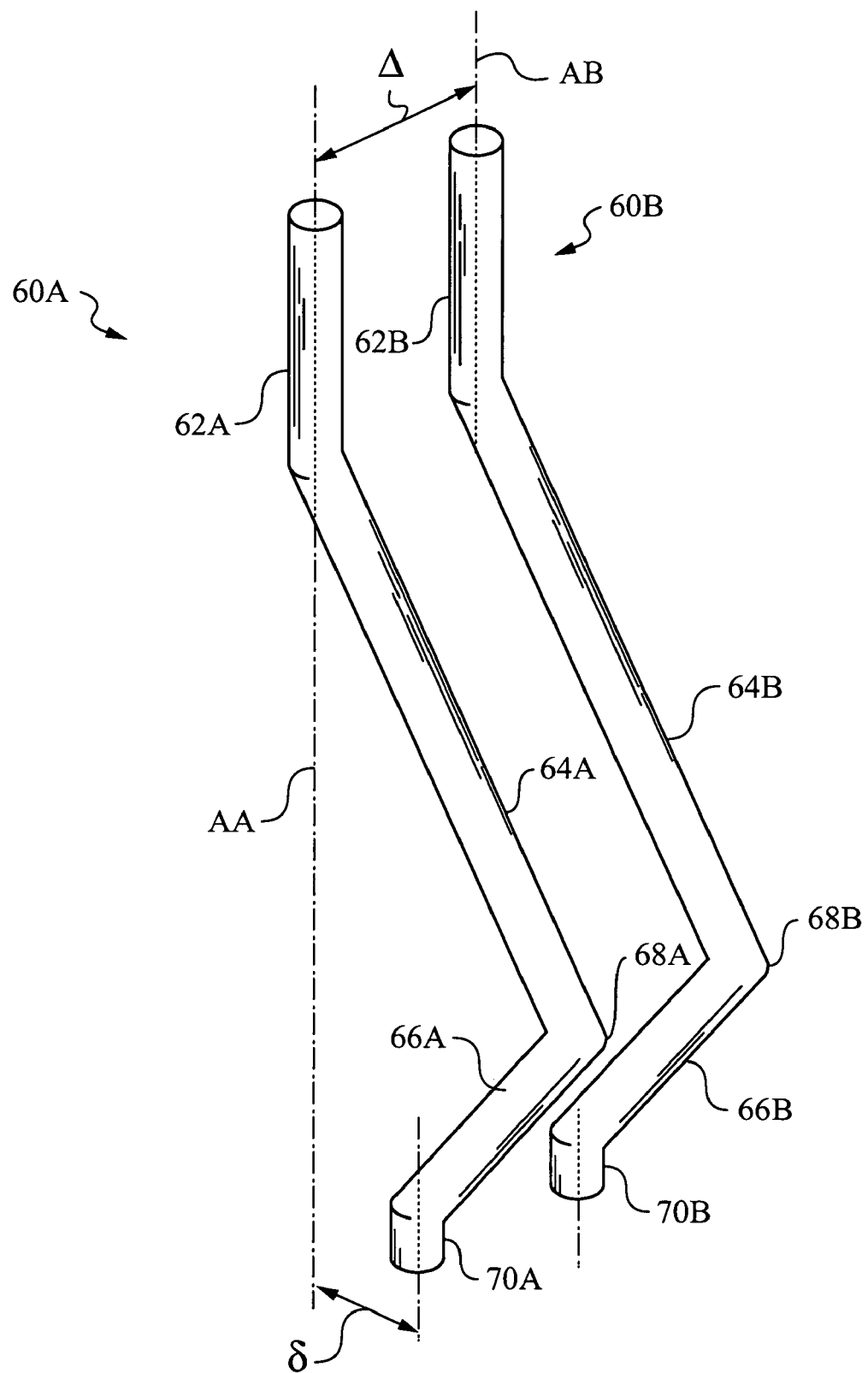
FIG. 2 is an isometric view of two probes that can be used in accordance with the invention.

Apparatus 10 can employ probes of various types and geometries, including probes with two or more arm portions. FIG. 2 is an isometric view of two exemplary probes 60A, 60B that can be used in apparatus 10. Each one of probes 60 has a retention portion 62A, 62B and two arm portions 64A, 66A and 64B, 66B, respectively. More precisely, arm portions 64A, 64B are base arm portions extending away from center axes AA, AB of probes 60A, 60B, and arm portions 66A, 66B are reverse arm portions extending back toward center axes AA, AB. Base and reverse arm portions 64A, 64B and 66A, 66B inflect at corresponding joints or knees 68A, 68B. This geometry lends probes 60A, 60B a measure of mechanical flexibility that allows contacting tips 70A, 70B of probes 60A, 60B to perform effective scrubbing movements when brought in contact with pads or bumps 14 of DUT 12.

Probes 60 have round cross-sections and are spaced at a pitch Δ. In a preferred embodiment, contacting tips 70A, 70B are located on reverse arm portions 66A, 66B distal from knees 68A, 68B with a non-zero offset δ relative to center axes AA, AB, respectively. Non-zero offset δ further improves the scrubbing behavior of probes 60.

Figure 3:
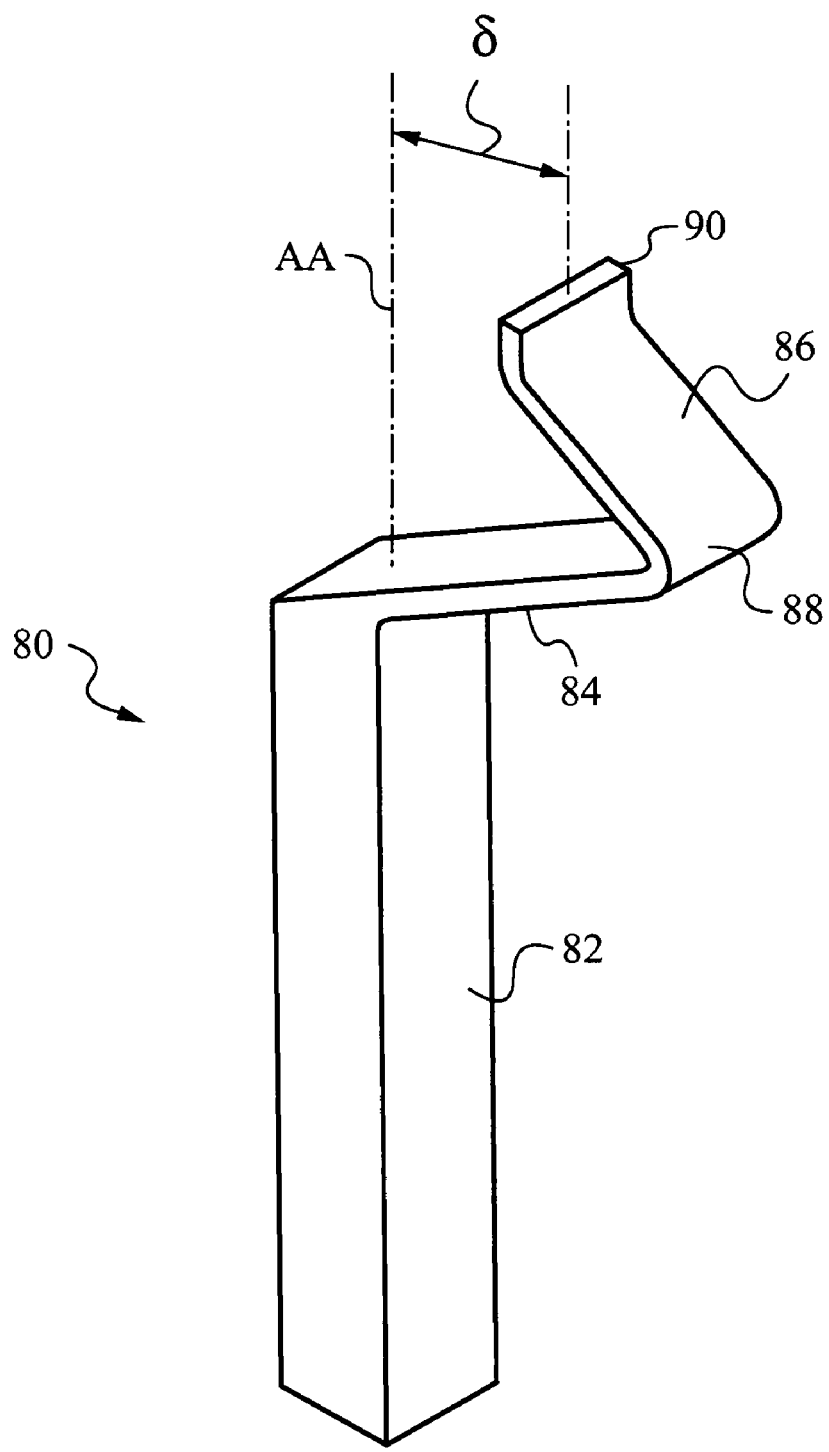
FIG. 3 is an isometric view of another probe that can be used in accordance with the invention.

Apparatus 10 can use other probes that have non-circular cross-sections. FIG. 3 illustrates in an isometric view a probe 80 that has a generally rectangular and varying cross-section. Probe 80 has a retention portion 82, a base arm portion 84, a reverse arm portion 86, a knee 88 and a contacting tip 90. Once again, contacting tip 90 has a non-zero offset δ relative to a center axis AA of probe 80 to achieve improved scrubbing motion.

Figure 4:
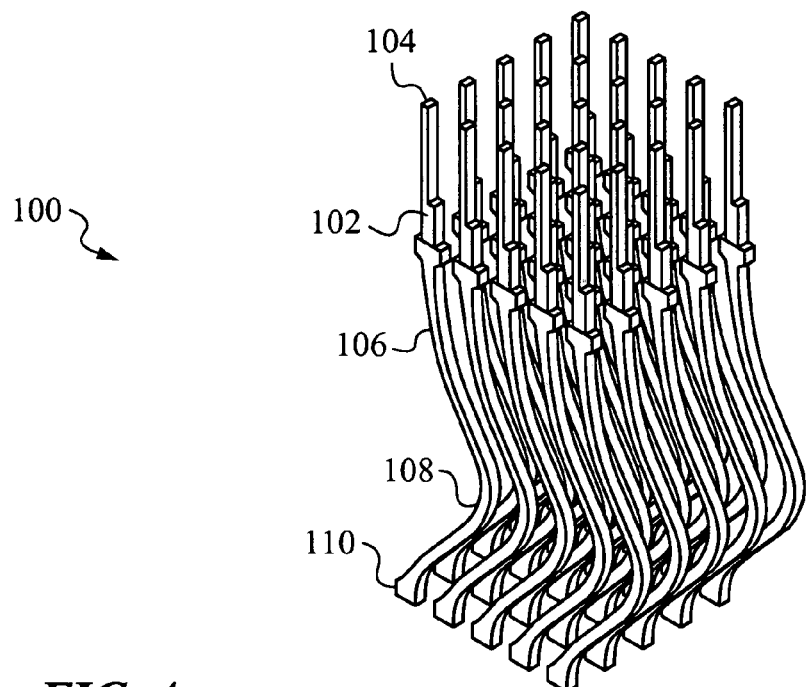
FIG. 4 is a three-dimensional view of other probes with non-linear portions.

In still other embodiments, apparatus 10 uses probes that have one or more non-linear arm portions. FIG. 4 illustrates an array of probes 100 each having a retention portion for being potted in retention arrangement 28 and a contact end 104. Each probe 100 has a non-linear arm portion 106 with a knee 108. Arm portion 106 terminates in a contacting tip 110. Note that contact end 104 of each probe 100 is designed for making side friction connections rather than a soldered connection. In other words, contact end 104 is designed to be placed into a metallized hole of a ceramic plate located above retention arrangement 28 and contact is established by sliding the ceramic plate sideways to ensure mechanical contact with contact end 104. In this case space transformer 44 establishes electrical connections with contact end 104 via a soldered connection to the ceramic plate. Alternatively, space transformer 44 may itself be provided with metallized holes for receiving contact end 104 of each probe 100. Also note, that in this embodiment there is no offset between contacting tip 110 and the center axis of probe 100.

Figure 5:
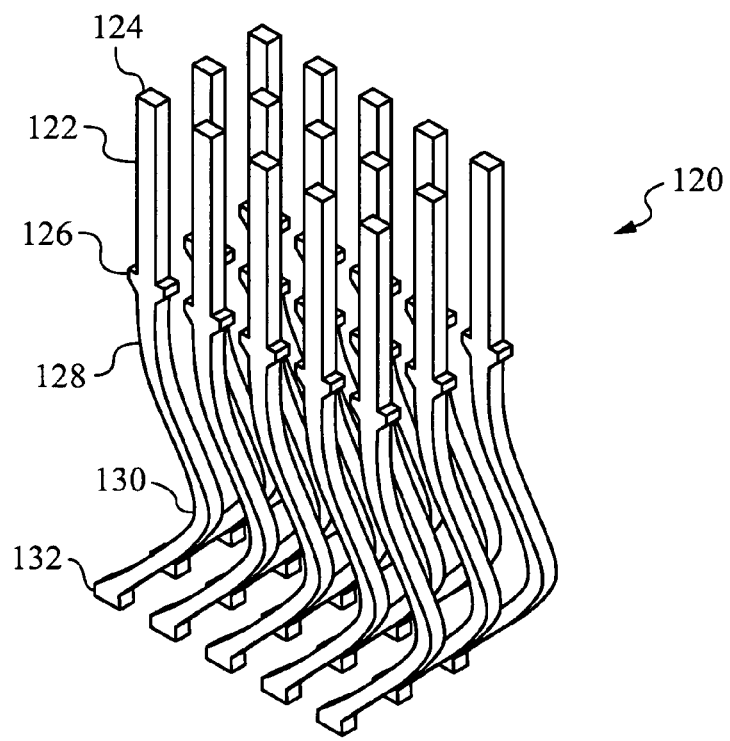
FIG. 5 is a three dimensional view of still other probes with non-linear portions.

FIG. 5. shows an array of probes 120 each having a retention portion 122 terminated in a contact end 124. A stop 126 is provided at the lower end of retention portion 122 to help align probes 120 in a retention arrangement and aid in maintaining their planarity. The presence of stop 126 also aids in keeping the potting agent in the potting region during assembly.

Each probe 120 has a non-linear arm portion 128 with a joint or knee 130. Non-linear arm portion 128 has a varying degree of curvature along its length and terminates in a contacting tip 132. Tip 132 is offset from the center axis of probe 120 in order to provide for improved scrubbing behavior.

Figure 6:
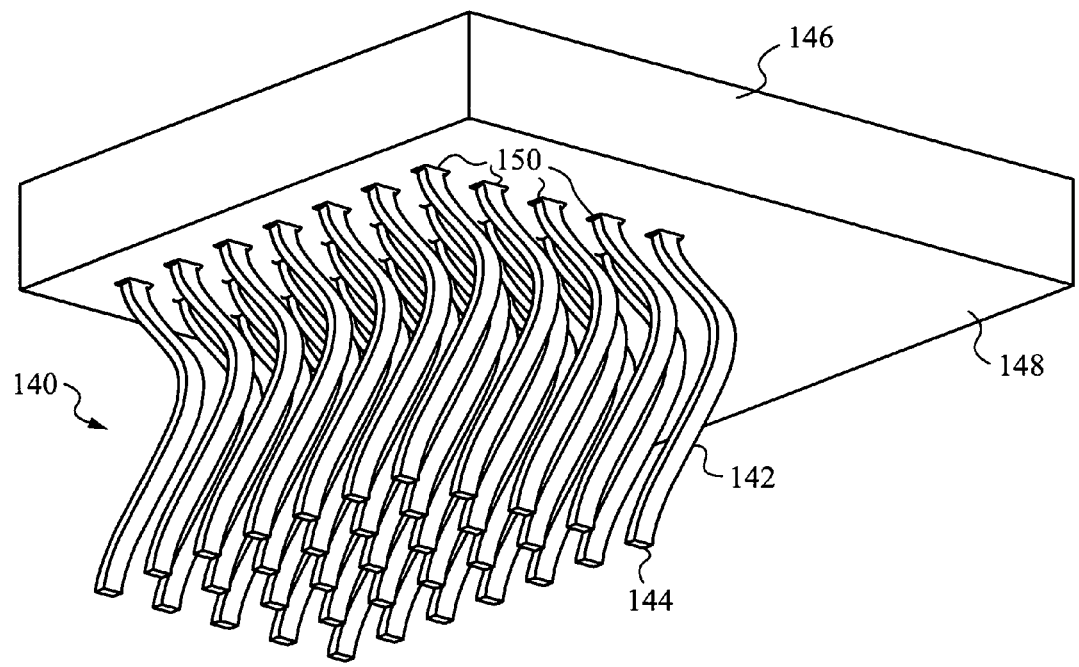
FIG. 6 is a three-dimensional view illustrating an array of probes held in a retention arrangement.

FIG. 6 is a three dimensional view illustrating an array of probes 140 each having a non-linear arm portion 142 and a contacting tip 144. Probes 140 are mounted in a retention arrangement 146 and extend out from plate 148 through openings 150. The holder for holding probes 140 at contacting tips 144 has been removed in this embodiment. Arrangement 146 is fully assembled and probes 140 are potted in the potting agent in the potting region (not visible) of arrangement 146.

Figure 7:
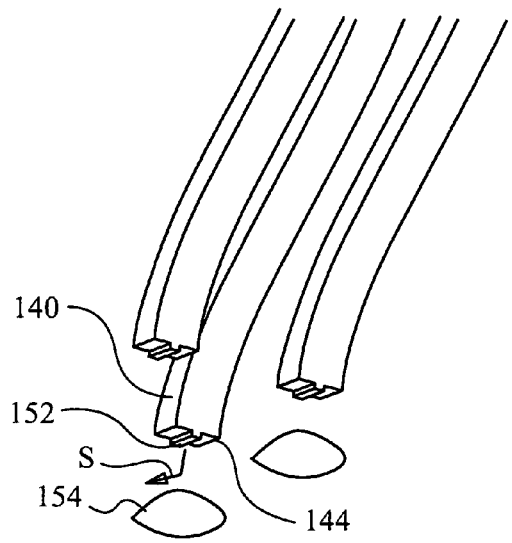
FIG. 7 is a three-dimensional view illustrating the operation of a scrubbing protrusion on a contacting tip of a probe from the array of FIG. 6.

FIG. 7 illustrates contacting tip 144 of a particular probe 140 in more detail. The bottom surface of tip 144, which is the surface that comes in contact with a pad or bump 154, is provided with a scrubbing protrusion 152. Protrusion 152 is a raised, rectangular portion of the bottom surface of tip 144. Although other geometries are possible, this type of protrusion 152 is preferred. During operation, as a contact force is applied, tip 144 comes in contact with bump 154 and executes a lateral scrubbing motion, as indicated by arrow S. The scrubbing motion helps to remove oxide from bump 154 and establish a good electrical contact.

Terminating the tips with scrubbing protrusions in any apparatus of the invention is preferred, since it improves the scrubbing behavior of the probes. It should also be noted, that due to the improved hold of the probes achieved by potting them in the potting enclosure, as well as any axial offset of their tips, all of these measures cooperate to produce a very effective scrubbing movement.

Figure 8:
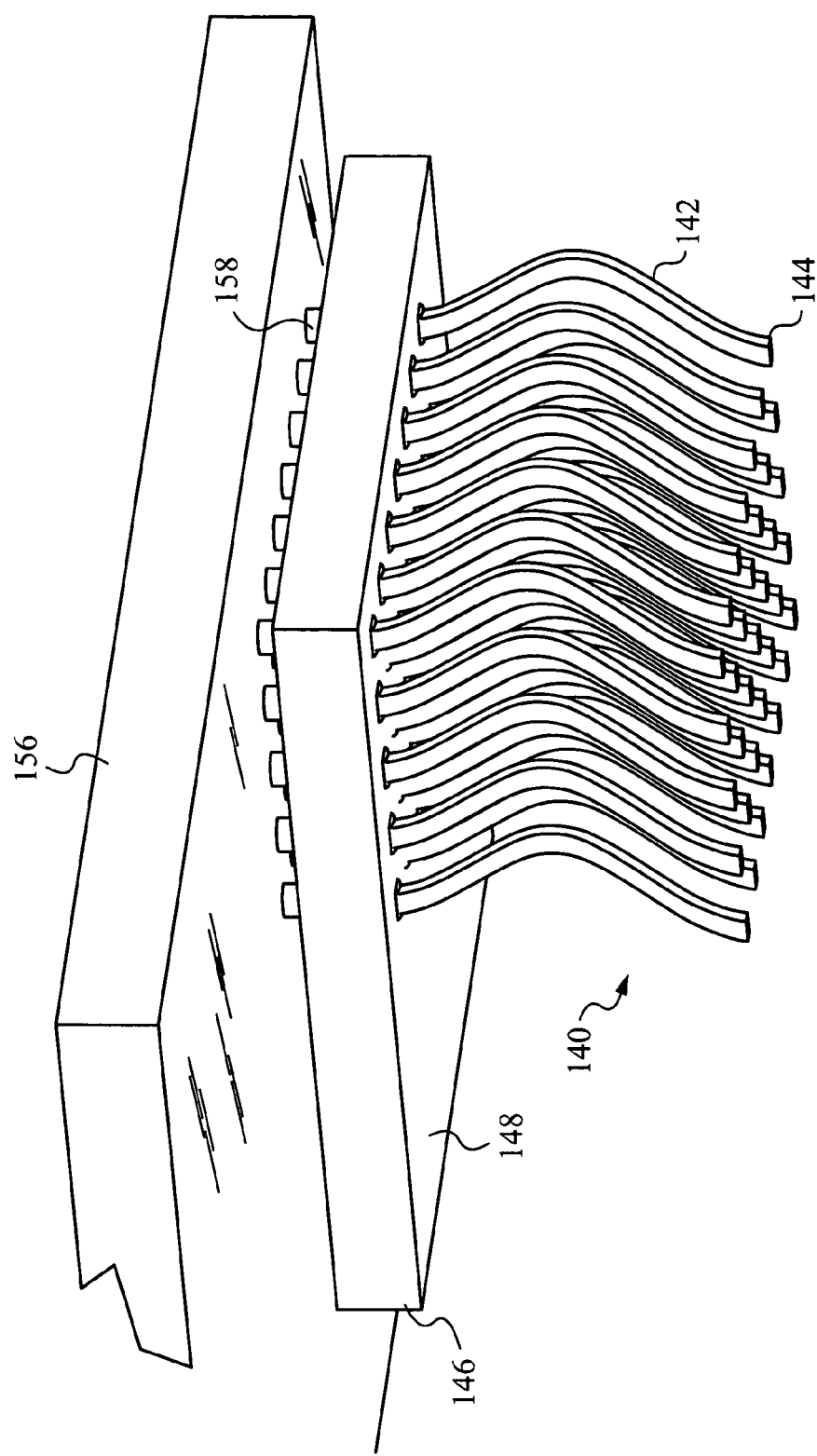
FIG. 8 is a three-dimensional view illustrating the array of probes and retention arrangement of FIG. 6 attached to a space transformer in accordance with the invention.

FIG. 8 is a three-dimensional view of the array of probes 140 in retention arrangement 146 attached to a space transformer 156. In this embodiment connections to space transformer 156 contacts are soldered connections 158. Once completed, connections 158 can be capped with an epoxy or adhesive for protection.

Figure 9A:
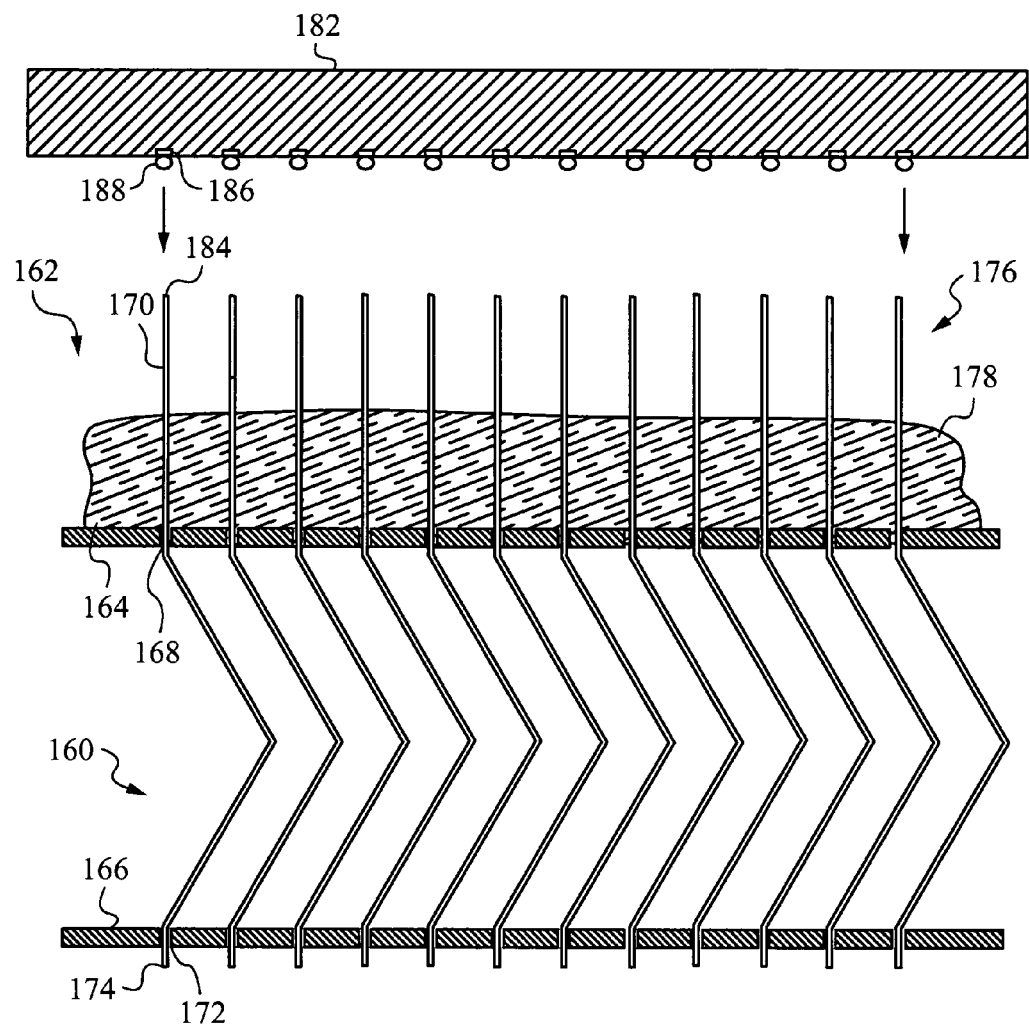
FIG. 9A is a plan cross sectional view illustrating a method of attaching probes held in a retention arrangement of FIG. 9 to a space transformer.

FIG. 9A is a plan cross sectional view illustrating a set of probes 160 in a retention arrangement 162 that employs plate 164 and holder 166. Plate 164 has openings 168 for holding probes 160 below their retaining portions 170. Holder 166 has openings 172 for keeping contacting tips 174 of probes 160. A potting region 176 is defined above plate 164. Potting region 176 does not include any lateral barriers for containing a potting agent 178. In this embodiment, agent 178 is a sufficiently viscous epoxy to not require containment prior to curing. In addition, epoxy 178 may be applied and cured in layers to build up to the required thickness without the need for lateral containment.

Figure 9B:
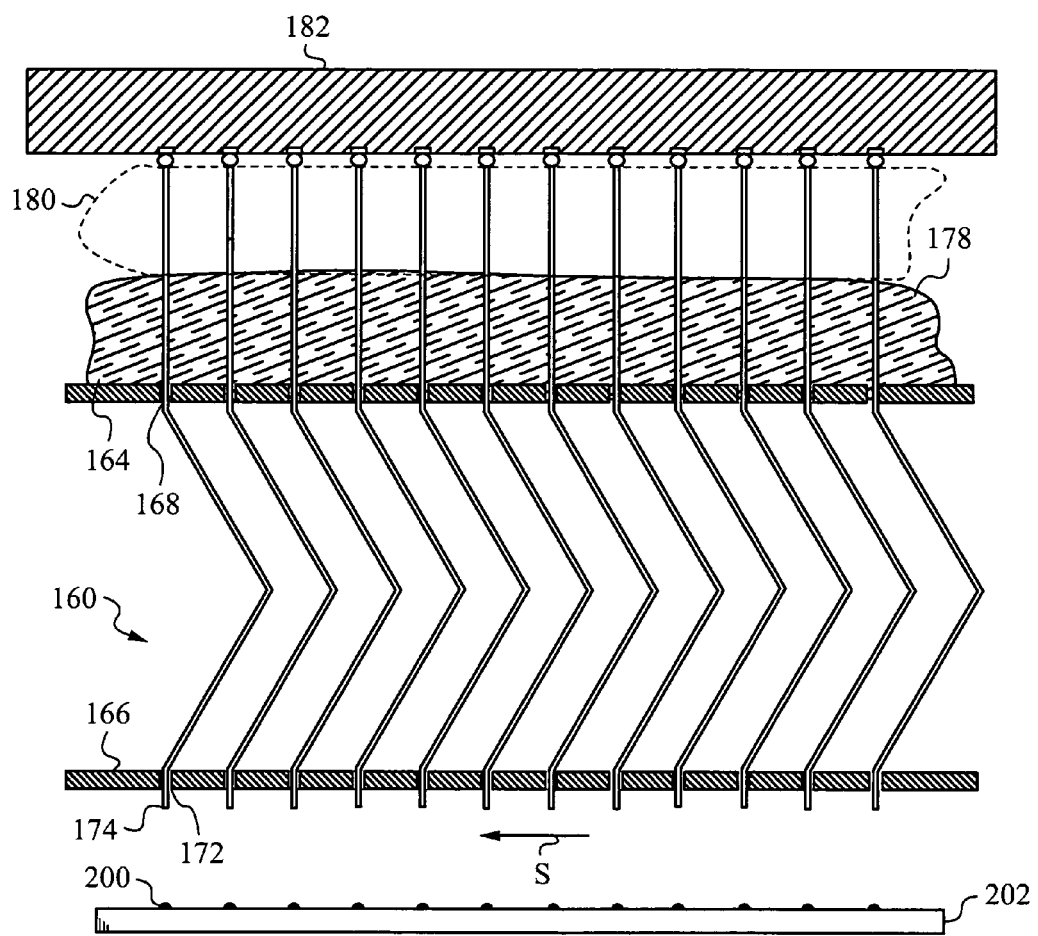
FIG. 9B is a plan cross sectional view illustrating the operation of probes in the retention arrangement of FIG. 9A when the holder is not removed.

In the view shown by FIG. 9 probes 160 are already potted in potting agent 178 and are being attached to a space transformer 182. To establish the electrical connection, connect ends 184 or probes 160 are brought in contact with and soldered to pads 186 of transformer 182 by re-flowing solder balls 188. Preferably, an underfill 180 (see FIG. 9B), typically of an epoxy or other stable dielectric is provided in order to strengthen the mechanical connection between transformer 182 and retention arrangement 162.

FIG. 9B is a plan cross sectional view illustrating the use of probes 160 mounted in retention arrangement 162 with holder 166 left in place over contacting tips 174 rather than removed. Due to the presence of holder 166 the motions and scrubs, as indicated by arrow S, of probes 160 are mechanically coupled. Thus, as contacting tips 174 engage with contact pads or bumps 200 of a DUT 202 they will tend to execute more concerted scrub motion. Of course, a person skilled in the art will recognize that the decision to remove or keep holder 166 can be made on a case by case basis and depending on planarity, scrub length and contact force requirements when dealing with any particular DUT 202.

Any of the above-described embodiments can be implemented in a full-fledged testing system or probe card. The retention arrangement of the invention provides excellent mechanical characteristics to the probes it holds. In particular, even in very dense arrays that address densely packed probe pads or bumps the probes are held securely while offering requisite mechanical properties such as resilience, compliance and reliable scrub motion to remove oxide from the contact pads or bumps.

Many other embodiments of the apparatus and method are possible. Therefore, the scope of the invention should be judged by the appended claims and their legal equivalents.

I claim:

1. An apparatus for electrical testing comprising:
   a plurality of probes each of said probes comprising a contacting tip, at least one arm portion, a connect end for applying a test signal, and a retention portion disposed between said connect end and said at least one arm portion; and
   a retention arrangement for holding at least some of said probes at said retention portion;
   said retention arrangement comprising a top plate having openings for said probes and a bottom plate having openings for said probes, wherein said top plate and said bottom plate comprise a space therebetween; and
   a removable tip holder disposed on said retention arrangement, said removable tip holder comprising openings for holding said probes near said contacting tips.

2. The apparatus of claim 1 wherein at least one of said plates comprises a ceramic material.

3. The apparatus of claim 1 further comprising a frame positioning said bottom plate relative to said tip holder.

4. The apparatus of claim 1 further comprising a potting region between said top plate and said bottom plate for potting a potting agent in said retention arrangement.

5. The apparatus of claim 4 wherein said potting agent comprises a low viscosity material.

6. The apparatus of claim 4 wherein said potting agent comprises an epoxy.

7. The apparatus of claim 4 further comprising a lateral barrier for enclosing said potting agent in said potting region.

8. The apparatus of claim 1 wherein at least one of said probes comprise a stop at a lower portion of said retaining portions.

9. The apparatus of claim 1 wherein at least one of said openings are laser-machined openings.

10. The apparatus of claim 1 employed in a probe card.

11. The apparatus of claim 1 wherein at least one of said probes are non-linear.

12. The apparatus of claim 1 wherein at least one of said probes comprise at least two arm portions joined by a knee.

13. The apparatus of claim 12 wherein said probe comprises at least two arm portions with a base arm portion extending away from a center axis of said probe and a reverse arm portion extending toward said center axis.

14. The apparatus of claim 12 wherein said probe comprises a non-linear arm portion extending from a center axis such that said contacting tip exhibits a non-zero offset relative to said center axis.

15. The apparatus of claim 1 wherein at least one of said probes comprises a protrusion on said contacting tip for ensuring electrical contact.

16. The apparatus of claim 15 wherein said protrusion comprises a raised, rectangular portion disposed on said contacting tip.

17. The apparatus of claim 1 further comprising a test device.

18. The apparatus of claim 1 wherein said probes provide a scrubbing motion executed by said contacting tips.

19. The apparatus of claim 1 wherein at least one of said probes comprises a round cross section.

20. The apparatus of claim 1 wherein at least one of said probes comprises a non-circular cross section.

21. The apparatus of claim 1 comprising a side friction connection.

22. The apparatus of claim 1 wherein at least one of said probes have a zero offset between said contacting tip and a center axis of said probe.

23. The apparatus of claim 4 wherein said retention portion further comprises at least one intermediate plate located in said potting region and having probe guiding openings for said probes.

24. The apparatus of claim 23 comprising a plurality of intermediate plates, said intermediate plates comprising sufficient inter-plate spacing to admit said potting agent therebetween.

25. The apparatus of claim 4 wherein said retention arrangement further comprises an opening for receiving said potting agent.

26. The apparatus of claim 1 further comprising a space transformer with contacts for contacting said probes at said connect end.

27. The apparatus of claim 13 wherein said contacting tip is located on said reverse arm portion distal to said knee and said contacting tip has a non-zero offset relative to said center axis.

28. The apparatus of claim 26 wherein at least one of said probes and a corresponding said contact are soldered together.

29. The apparatus of claim 28 wherein said contact and said probe are soldered together with a soldering ball.

30. The apparatus of claim 29 wherein said contact and said probe are soldered together with a re-flowed soldering ball.

31. The apparatus of claim 26 wherein said contacts are metallized contacts.

32. An apparatus for electrical testing comprising:
   a plurality of probes each of said probes comprising a contacting tip, at least one arm portion, a connect end for applying a test signal, and a retention portion disposed between said connect end and said at least one arm portion;
   a retention arrangement for holding at least some of said probes at said retention portion;
   said retention arrangement comprising a top plate having openings for said probes and a bottom plate having openings for said probes, wherein said top plate and said bottom plate comprise a space therebetween;
   a tip holder disposed on said retention arrangement, said tip holder comprising openings for holding said probes near said contacting tips; and
   a frame positioning said bottom plate relative to said tip holder.

33. The apparatus of claim 32 wherein said tip holder is removable.

34. The apparatus of claim 32 wherein at least one of said plates comprises a ceramic material.

35. The apparatus of claim 32 further comprising a potting region between said top plate and said bottom plate for potting a potting agent in said retention arrangement.

36. The apparatus of claim 35 wherein said potting agent comprises a low viscosity material.

37. The apparatus of claim 35 wherein said potting agent comprises an epoxy.

38. The apparatus of claim 35 further comprising a lateral barrier for enclosing said potting agent in said potting region.

39. The apparatus of claim 35 wherein said retention portion further comprises at least one intermediate plate located in said potting region and having probe guiding openings for said probes.

40. The apparatus of claim 39 comprising a plurality of intermediate plates, said intermediate plates comprising sufficient inter-plate spacing to admit said potting agent therebetween.

41. The apparatus of claim 35 wherein said retention arrangement further comprises an opening for receiving said potting agent.

42. The apparatus of claim 32 wherein at least one of said probes comprise a stop at a lower portion of said retaining portions.

43. The apparatus of claim 32 wherein at least one of said openings are laser-machined openings.

44. The apparatus of claim 32 disposed in a probe card.

45. The apparatus of claim 32 wherein at least one of said probes are non-linear.

46. The apparatus of claim 32 wherein at least one of said probes comprise at least two arm portions joined by a knee.

47. The apparatus of claim 46 wherein said probe comprises at least two arm portions with a base arm portion extending away from a center axis of said probe and a reverse arm portion extending toward said center axis.

48. The apparatus of claim 46 wherein said contacting tip is located on said reverse arm portion distal to said knee and said contacting tip has a non-zero offset relative to said center axis.

49. The apparatus of claim 32 wherein said probe comprises a non-linear arm portion extending from a center axis such that said contacting tip exhibits a non-zero offset relative to said center axis.

50. The apparatus of claim 32 wherein at least one of said probes comprises a protrusion on said contacting tip for ensuring electrical contact.

51. The apparatus of claim 50 wherein said protrusion comprises a raised, rectangular portion disposed on said contacting tip.

52. The apparatus of claim 32 further comprising a test device.

53. The apparatus of claim 32 wherein said probes provide a scrubbing motion executed by said contacting tips.

54. The apparatus of claim 32 wherein at least one of said probes comprises a round cross section.

55. The apparatus of claim 32 wherein at least one of said probes comprises a non-circular cross section.

56. The apparatus of claim 32 comprising a side friction connection.

57. The apparatus of claim 32 wherein at least one of said probes have a zero offset between said contacting tip and a center axis of said probe.

58. The apparatus of claim 32 further comprising a space transformer with contacts for contacting said probes at said connect end.

59. The apparatus of claim 58 wherein at least one of said probes and a corresponding said contact are soldered together.

60. The apparatus of claim 59 wherein said contact and said probe are soldered together with a soldering ball.

61. The apparatus of claim 59 wherein said contact and said probe are soldered together with a re-flowed soldering ball.

62. The apparatus of claim 58 wherein said contacts are metallized contacts.

63. An apparatus for electrical testing comprising:
a plurality of probes each of said probes comprising a contacting tip, at least one arm portion, a connect end for applying a test signal, and a retention portion disposed between said connect end and said at least one arm portion;
a retention arrangement for holding at least some of said probes at said retention portion;
said retention arrangement comprising a top plate having openings for said probes and a bottom plate having openings for said probes, wherein said top plate and said bottom plate comprise a space therebetween;
a potting region between said top plate and said bottom plate for potting a potting agent in said retention arrangement; and
at least one intermediate plate located in said potting region and having probe guiding openings for said probes.

64. The apparatus of claim 63 further comprising a tip holder disposed on said retention arrangement, said tip holder comprising openings for holding said probes near said contacting tips.

65. The apparatus of claim 64 further comprising a frame positioning said bottom plate relative to said tip holder.

66. The apparatus of claim 64 wherein said tip holder is removable.

67. The apparatus of claim 63 wherein at least one of said plates comprises a ceramic material.

68. The apparatus of claim 63 wherein said potting agent comprises a low viscosity material.

69. The apparatus of claim 63 wherein said potting agent comprises an epoxy.

70. The apparatus of claim 63 further comprising a lateral barrier for enclosing said potting agent in said potting region.

71. The apparatus of claim 63 comprising a plurality of intermediate plates, said intermediate plates comprising sufficient inter-plate spacing to admit said potting agent therebetween.

72. The apparatus of claim 63 wherein said retention arrangement further comprises an opening for receiving said potting agent.

73. The apparatus of claim 63 wherein at least one of said probes comprise a stop at a lower portion of said retaining portions.

74. The apparatus of claim 63 wherein at least one of said openings are laser-machined openings.

75. The apparatus of claim 63 disposed in a probe card.

76. The apparatus of claim 63 wherein at least one of said probes are non-linear.

77. The apparatus of claim 63 wherein at least one of said probes comprise at least two arm portions joined by a knee.

78. The apparatus of claim 63 wherein said probe comprises at least two arm portions with a base arm portion extending away from a center axis of said probe and a reverse arm portion extending toward said center axis.

79. The apparatus of claim 78 wherein said contacting tip is located on said reverse arm portion distal to said knee and said contacting tip has a non-zero offset relative to said center axis.

80. The apparatus of claim 63 wherein said probe comprises a non-linear arm portion extending from a center axis such that said contacting tip exhibits a non-zero offset relative to said center axis.

81. The apparatus of claim 63 wherein at least one of said probes comprises a protrusion on said contacting tip for ensuring electrical contact.

82. The apparatus of claim 81 wherein said protrusion comprises a raised, rectangular portion disposed on said contacting tip.

83. The apparatus of claim 63 further comprising a test device.

84. The apparatus of claim 63 wherein said probes provide a scrubbing motion executed by said contacting tips.

85. The apparatus of claim 63 wherein at least one of said probes comprises a round cross section.

86. The apparatus of claim 63 wherein at least one of said probes comprises a non-circular cross section.

87. The apparatus of claim 63 comprising a side friction connection.

88. The apparatus of claim 63 wherein at least one of said probes have a zero offset between said contacting tip and a center axis of said probe.

89. The apparatus of claim 63 further comprising a space transformer with contacts for contacting said probes at said connect end.

90. The apparatus of claim 89 wherein at least one of said probes and a corresponding said contact are soldered together.

91. The apparatus of claim 90 wherein said contact and said probe are soldered together with a soldering ball.

92. The apparatus of claim 90 wherein said contact and said probe are soldered together with a re-flowed soldering ball.

93. The apparatus of claim 89 wherein said contacts are metallized contacts.

* * * * *